United States Patent [19]

Cabourne

[11] Patent Number: 4,904,197

[45] Date of Patent: Feb. 27, 1990

[54] HIGH DENSITY ZIF EDGE CARD CONNECTOR

[75] Inventor: Michael K. Cabourne, Santa Ana, Calif.

[73] Assignee: ITT Corporation, New York, N.Y.

[21] Appl. No.: 296,566

[22] Filed: Jan. 13, 1989

[51] Int. Cl.[4] .................................... H05K 1/00

[52] U.S. Cl. .................................... 439/260; 439/265; 439/267; 439/635; 439/637

[58] Field of Search ................ 439/835, 912, 260–270, 439/629–637; 29/854, 739–747; 324/158

[56] References Cited

U.S. PATENT DOCUMENTS

| | | | |
|---|---|---|---|
| 3,639,888 | 2/1972 | Pittman et al. | 439/260 |
| 3,897,991 | 8/1975 | Pritulsky | 439/260 |
| 3,899,234 | 8/1975 | Yeager et al. | 339/74 |
| 4,179,176 | 12/1979 | Jayne | 439/267 |
| 4,303,294 | 12/1981 | Hamsher, Jr. et al. | 339/74 |
| 4,428,635 | 1/1984 | Hamsher, Jr. et al. | 339/74 |
| 4,468,073 | 8/1984 | Machcinski | 339/74 |
| 4,553,804 | 11/1985 | Lapraik et al. | 339/74 |
| 4,606,594 | 8/1986 | Grabbe et al. | 339/74 |
| 4,695,111 | 9/1987 | Grabbe et al. | 439/266 |

*Primary Examiner*—David Pirlot

*Attorney, Agent, or Firm*—Thomas L. Peterson

[57] ABSTRACT

A zero insertion force edge card connector is described, for connecting to cards with closely-spaced conductive pads, which is rugged and reliable. The connector includes numerous elongated contacts, each having a middle portion embedded in a dielectric frame element, a terminal end portion extending from the frame towards a card-receiving region, and a tail portion extending from the frame element to a base. The frame element is movably supported on the base by the flexible tail portions of the contacts, and can move towards and away from the card-receiving region by bending of the tail portions. The multiple contacts avoid uncontrolled rotation of the frame element. A spring urges a pair of frame elements together, and a cam controls movement of the frame elements.

15 Claims, 4 Drawing Sheets

FIG. 2
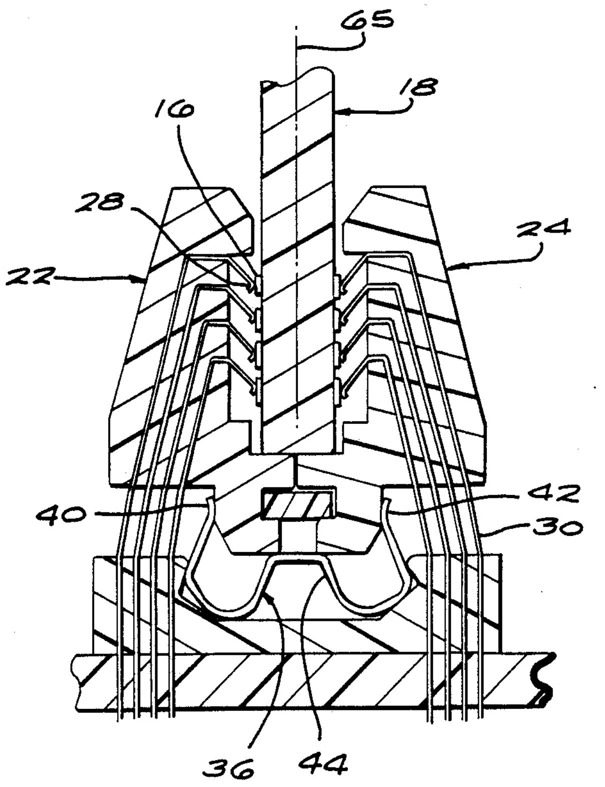
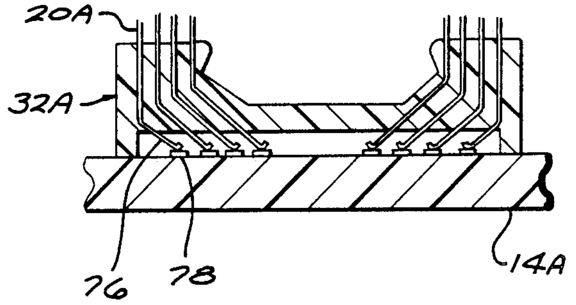
FIG. 11

FIG. 4
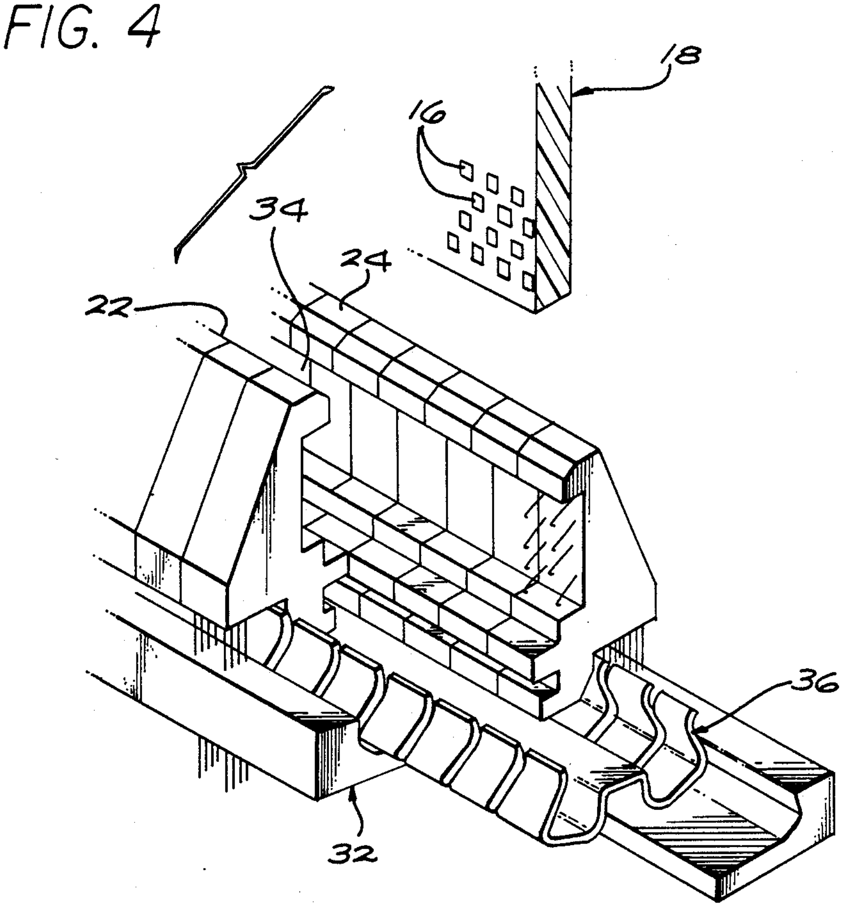
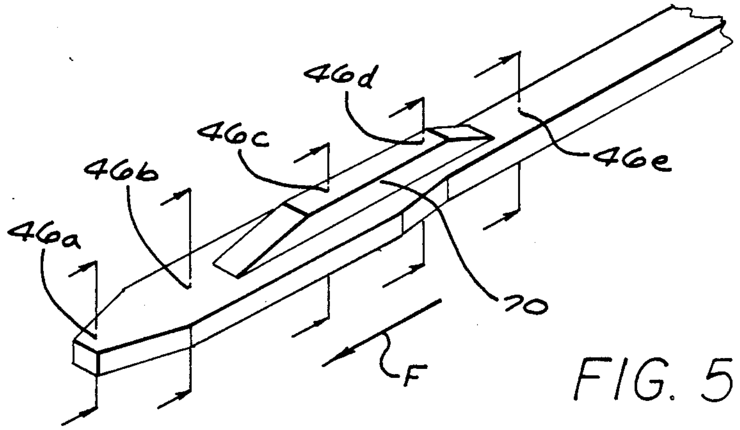
FIG. 5

HIGH DENSITY ZIF EDGE CARD CONNECTOR

BACKGROUND OF THE INVENTION

Removable circuit modules such as "cards" that can be installed in large computers, may have a large number of terminals that must be connected to a corresponding large number of terminals on another circuit, such as a nonremovable circuit in the computer. For example, the removable card or module may have several rows of conductive pads extending parallel to the edge of the card, with the pads along each row spaced perhaps 10 to 25 mils (1 mil equals 1 thousandth inch) apart along a card having a length of perhaps 20 to 30 inches. It is often desirable to provide a zero insertion force connector to avoid damage to the card and to the connector contacts. Since the contacts are very small and closely spaced, it is important to closely control relative contact position to keep them spaced from one another, and to closely control their terminal ends which move against the pads on the card. A connector which closely maintained relative contact position and closely positioned the terminal portions of the contacts, in a connector of rugged and relatively low cost design, would be of considerable value.

SUMMARY OF THE INVENTION

In accordance with one embodiment of the present invention, an electrical connector is provided, which has multiple contacts with closely-spaced terminals for contacting the terminals of a removable module, wherein the connector reliably closely holds the contacts. The contacts each have a middle portion held in a dielectric frame element, a terminal end portion projecting from the frame element to mate with corresponding terminals on a removable module, and a flexible elongated tail extending from the frame element to a base. The frame element is supported in movement towards and away from a module-receiving region by the flexible tails of the contacts. The contacts held in a frame element are preferably arranged with the tails of different contacts spaced laterally so they lie at different distances from the module-holding region, and with different contacts spaced longitudinally, to prevent or closely control rotation of the frame element.

A pair of frame elements and their corresponding contacts lie on opposite sides of the module receiving region, and a spring urges the frame elements towards the contact-receiving region. The spring can include a separating portion lying between the frame elements to keep them separated, until a cam pushes the separating portion of the spring out of a position between the frame elements.

The novel features of the invention are set forth with particularity in the appended claims. The invention will be best understood from the following description when read in conjunction with the accompanying drawings.

BRIEF DESCRIPTION OF THE DRAWINGS

FIG. 2 is a view similar to that of FIG. 1, but with the connector in a closed or mating position wherein the contacts mate with corresponding terminals on the module.

FIG. 4 is a partial perspective view of the connector of FIG. 1, with the removable module away from the connector.

FIG. 5 is a partial perspective view of a cam of the connector of FIG. 1.

FIG. 11 is a sectional side view of another embodiment of the invention.

DESCRIPTION OF THE PREFERRED EMBODIMENTS

Figure 1:
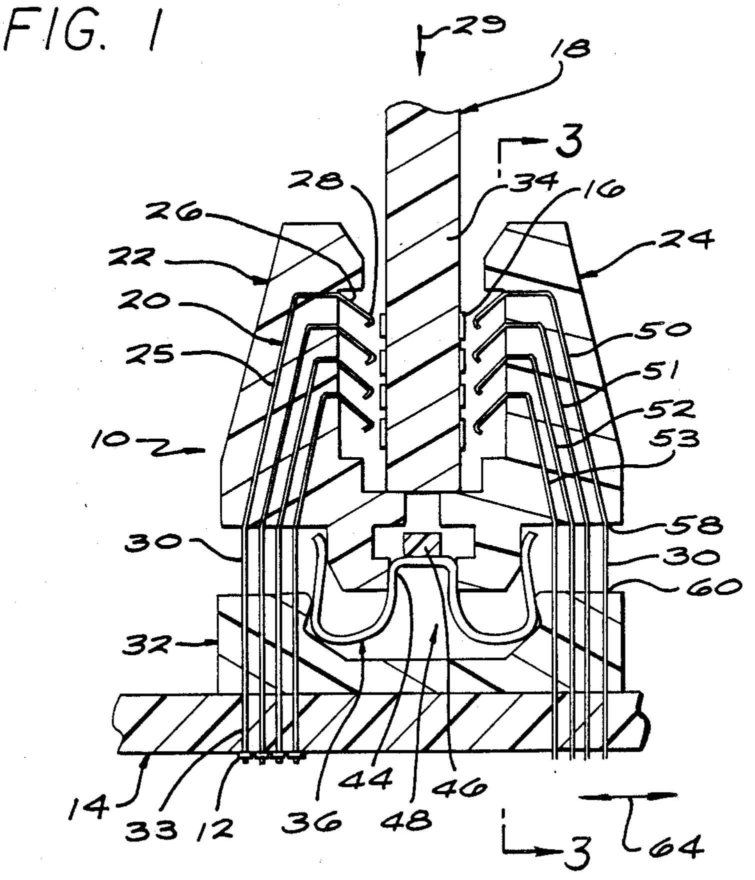
FIG. 1 is a sectional side view of a connector and removable module, with the connector in an open position wherein its contacts do not engage terminals of the module.

5 FIG. 1 illustrates a connector 10 which is designed to connect multiple conductors 12 of a circuit 14, which may be referred to as a back plane, to multiple terminals in the form of conductive pads 16 on a removable module 18. The removable module, often referred to as a module wiring board or a card, may have a large number of conductive pads 16, such as hundreds or thousands of them arranged in several rows, and with the pads spaced apart by perhaps 10 to 25 mils (one mil equals one thousandth inch). A plurality of thin contacts 20 make the connections between the conductors of circuit 14 and the terminals or pads 16 on the removable module, in a manner that allows the module to be inserted with substantially zero force (that is, no resistance by the contacts). A pair of dielectric segments or frame elements 22, 24 hold the contacts 20 in positions relative to one another, to closely control their relative positions so they do not inadvertently touch one another and so their terminal ends reliably move against and away from the pads on the removable module.

The contacts 20 have middle portions 25 that are closely held to the frame elements as by embedding the middle portions in the frame elements. Each contact also has a terminal end portion 26 extending with a directional component toward the module 18, and having a terminal 28 for contacting the pads on the module. Each contact also has an elongated flexible contact tail portion or tail 30 extending from a frame element to a base 32. The contacts have inner ends 33 that connect to the back plane conductors 12. Each frame element such as 22 is supported by the contact tails 30 on the base 32. The frame can move horizontally as to the closed position of FIG. 2, by flexing of the contact tails 30.

A module 18 can be inserted into the connector when the frame elements 22, 24 are in the open-connector position of FIG. 1, so the terminals 28 of the contacts are away from the insertion path 29 of the module. The module can be guided to the position of FIG. 1 by guides (not shown). Once the module has been inserted into a largely planar module-receiving region 34 between the frame elements, the frame elements are moved towards each other and therefore towards the module-receiving region 34. The frame elements then reach the closed-connector position shown in FIG. 2, wherein the contact terminals 28 contact the conductive pads 16 of the module. A spring 36 has frame-engaging portions 40, 42 that urge the frame elements towards each other. The spring also has a frame-separating portion 44 which can be positioned as shown in FIG. 1, to keep the frames apart. A cam 46 is operable to push down the frame-separating portion 44 of the spring to allow the frame elements to move together to the closed position of FIG. 2. The cam 44 can also separate the frame elements to move them to the open position, to allow the module to be removed and another one inserted. The combination of spring 36 and cam 46 forms a device 48 that is actuatable to cause the frames to move toward and away from the module-receiving region 34.

The frame elements 22, 24 hold the contacts 20 so they can lie close to one another, and still remain reliably out of contact with each other. The fact that the frame elements hold portions of the contact near the cantilevered or free terminal end portions 26, results in close control of the terminal portions. However, since the frame elements can move, they allow movement of the contact terminal portions by a considerable distance, to firmly engage the pads on the removable module.

Figure 3:
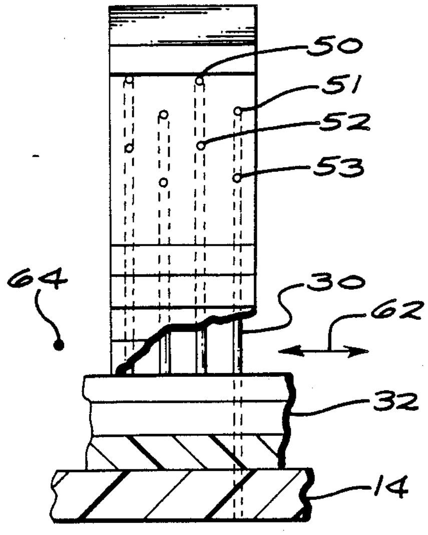
FIG. 3 is a view taken on the line 3—3 of FIG. 1.

Each frame element such as 24 includes several contacts such as those shown at 50–53. The tails of the contacts 50 and 53 are spaced in a lateral direction 64 so they lie at different distances from an imaginary extension of the module-receiving region 34, or in other words, from an imaginary plane 65 which the module lies in. As a result, the spaced tails prevent uncontrolled pivoting of the frame element 24. In the connector of FIG. 1, the tails of contacts 50 and 53 are of the same length, in that the opposite ends 58, 60 of the tail portions of the two contacts are equally spaced, to form two sides of a parallelogram (the frame element 24 and base 32 form the other sides). This results in the frame element 24 moving to the position shown in FIG. 2, without rotation of the frame element. In addition, the tail portions or tails of at least two contacts such as 52 and 53 shown in FIG. 3, are spaced apart at least partially along a longitudinal direction 62 that is perpendicular to the lateral direction 64 along which the frame elements 22, 24 move between the open and closed position, and also perpendicular to the lengths of the contacts tail portions 30. Such spacing prevents tilting of the frame elements about an axis extending parallel to the lateral direction 64. By mounting the middle portions of a plurality of contacts in each frame element, and having the tail portions of the contacts spaced apart, applicant closely controls the relative positions of the contacts and movement of the terminal end portions 26 of contacts, while using small diameter flexible contacts.

It may be noted that it is possible to make the tails of different contacts of different heights, to produce controlled rotation of the frame elements. For example, the tail of contact 53 can be made shorter than the tail of contact 50, to produce counterclockwise pivoting of the frame element 24 of FIG. 1 as it moves to the closed position. In any case, the tails extend primarily perpendicular to the lateral direction 64 along which the frame elements move.

Figure 6:
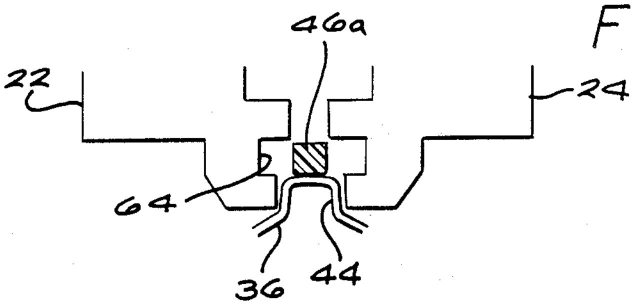
FIGS. 6–10 are views of a portion of the connector of FIG. 1, showing different sections of the cam of FIG. 5 and their interaction with frame elements of the connector.
Figure 7:
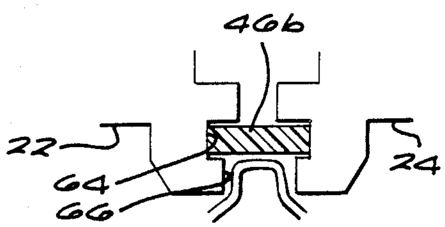

As mentioned above, while the frame engaging portions 40, 42 of the spring urge the frame elements together, a middle frame-separating portion 44 initially keeps the frame elements apart. The cam 46 which controls movement of the frame elements is shown in FIG. 5, and its manner of operation is shown in FIGS. 6–10. The cam 46 has several different cross sections **46*a*–46*e*. FIG. 6 shows the connector in the fully open position, wherein the cam section 46*a* lies between the cam-engaging surfaces 64 of the frame elements, but does not affect operation. At that time, the middle or frame-separating portion 44 of spring 36 keeps the frame elements apart. As the cam is slid forward in the direction of arrow F (FIG. 5) the section 46*b* further separates the frame elements 22, 24, as shown in FIG. 7, so frame element surfaces 66** do not press against the middle of the spring, and therefore a load is taken off the middle spring portion.

Figure 8:
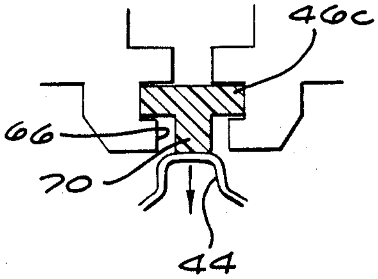
Figure 9:
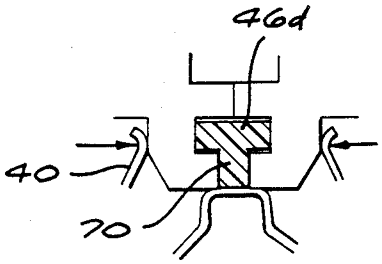
Figure 10:
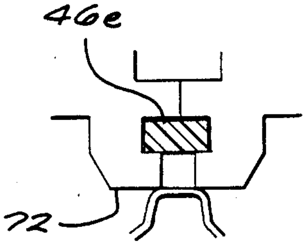

As the cam continues moving forward cam section **46*c*, shown in FIG. 8, operates the apparatus. Cam section 46*c* has a spring-depressing portion 70 that pushes down the middle spring portion 44 so it is below the surfaces 66 on the frame elements. Further forward movement of the cam brings section 46*d* into operation as shown in FIG. 9. Section 46*d* has a small lateral width to allow the frame elements to move together but still includes the spring-depressing portion 70 which is narrower than the frame-separating middle portion 44 of the spring. The cam portion 70 keeps the middle spring portion depressed while allowing the frame elements to move together under the force of the end portions or frame-engaging portions 40, 42 of the spring. Applicant also provides a cam section 46*e* shown in FIG. 10, which is similar to the last cam section 46*d*, except that it does not include a spring-depressing portion 70. This results in avoiding loads and consequent friction of the spring on the cam. In the position of FIG. 10, the spring-depressing surfaces 72** of the frame element hold down the middle spring portion.

As shown in FIG. 4, applicant forms the connector with numerous individually-moveable frame elements 22, 24 lying on opposite sides of the module-receiving region 34. Also, numerous individual springs 36 are provided, each biasing a pair of frame elements together. Providing numerous frame elements and their corresponding groups of contacts, results in the numerous frame elements being moved in sequence between the closed and open positions as the cam is moved, instead of all frame elements moving simultaneously. This has an advantage in enabling the cam to operate the connector with a relatively small force applied to the cam along its path of motion of perhaps 20 inches for a connector that is 20 inches long, during which it may move hundreds of frame elements. In addition, this arrangement enables repair of the connector in case one of the contacts is damaged beyond repair, in as much as a corresponding frame element with a limited group of contacts is then replaced.

The contacts of the connector can be mounted to corresponding conductors on the back plane or circuit 14 (FIG. 1) in a number of different ways. Fig. 11 illustrates an arrangement where the contacts 20A have inner end portions 76 which make contact with pads 78 on the back plane circuit 14A. This arrangement enables the connector to be detachable connected to the circuit 14A.

Thus, the invention provides an electrical connector for connecting to a removable module, which enables close control of the positions of closely-spaced thin contacts, and especially of their terminal ends, in a relatively simple and rugged construction. The connector includes a plurality of contacts with middle portions held in dielectric frame elements. The contacts have terminal end portions projecting from the frame elements to contact a removable module, and have elongated flexible tails that support the frame elements in movement towards and away from the removable module. The plurality of contacts include tails at different spacings from the module-receiving region to prevent or otherwise control rotation of the frame element as it moves towards and away from the module-receiving region. A spring urges a pair of frame elements towards the module-receiving region, and a frame-separating device which may be part of the spring, can hold the frame elements apart. A cam which operates the connector, can include portions that move the frame elements slightly further apart, then push the frame-separating spring portion out from between the frame elements. Another cam portion then allows the frame elements to move together while keeping the separating portion out of the way.

Although particular embodiments of the invention have been described and illustrated herein, it is recognized that modifications and variations may readily occur to those skilled in the art and consequently it is intended to cover such modifications and equivalents.

What is claimed is:

1. An electrical connector for connecting to a removable module, comprising:

a base;

a pair of frame elements of dielectric material, said elements having module-facing portions that are spaced apart to form a module-receiving region between them, said elements being moveable substantially in lateral directions toward and away from said module-receiving region;

a plurality of elongated electrically conductive contacts, each contact having a middle portion held in one of said frame elements, each contact having a terminal end portion projecting from the frame element with a directional component toward said module-receiving region, and each contact having a flexible elongated tail portion extending between the frame element and said base and supporting the frame element in movement toward and away from said module-receiving region by bending of the flexible tail portion;

each of said frame elements holding the middle portions of a plurality of said contacts, with said plurality of contacts having their tail portions extending primarily parallel but spaced apart;

a device coupled to said frames and actuatable to cause said frames to move toward and away from said module-receiving region.

2. The connector described in claim 1 wherein:

said module-receiving region lies substantially in a plane;

said tail portions extend primarily perpendicular to said lateral direction, and said plurality of tail portions lie at different distances from said plane, whereby to resist element pivoting about an axis extending perpendicular to said lateral direction and to the length of said tail portions.

3. The connector described in claim 1 wherein:

each of said frame elements holds the middle portions of at least four of said contacts, with the tail portions of at least two of said contacts lying at different distances from an imaginary extension of said module-receiving region, and with the tail portions of at least two of said contacts spaced at least partially along a direction perpendicular to both said lateral direction and to the lengths of said tail portions.

4. The connector described in claim 1 wherein:

said device includes a spring coupled to said pair of frame elements and which urges them toward said module-receiving region, and a cam coupled to said frame elements and operable to move said elements apart against the force of said spring.

5. The connector described in claim 1 wherein:

said device includes a spring with end portions that are engaged with said frame elements and that urges them together toward said module-receiving region, said spring being moveable between open-connector and closed-connector positions wherein said frame elements are respectively furthest apart and closest together, said spring having a middle portion which can lie between said frame elements in said open-connector position to prevent said frame elements from moving toward each other, and said device includes a cam member which is actuatable to force said spring middle portion from between said frame elements to allow said frame elements to move toward said closed-connector position.

6. In a module-receiving connector which includes a module-receiving region and a plurality of elongated flexible electrically conductive contacts with flexible elongated tail portions mounted on a base, with terminal contact portions lying adjacent to a side of said region, and with middle contact portions between said tail and termination portions, the improvement including:

a frame element of dielectric material spaced from said base, said middle portions of said plurality of contacts being substantially embedded in said frame element to fix their relative positions and orientations, said terminal contact portions extending generally toward said region, and said frame element being supported in movement generally toward and away from said module-receiving region primarily by said flexible elongated tail portions of said contacts.

7. The improvement described in claim 6 wherein:

said plurality of contacts includes first and second contacts whose tail portions lie at different distances from said module-receiving region.

8. The improvement described in claim 6 wherein:

said terminal portions of said contacts move primarily in a predetermined lateral direction when said frame element moves toward and away from said module-receiving region, and said elongated tail portions extend primarily in a predetermined second direction perpendicular to said lateral direction; and said plurality of contacts includes first and second contacts whose tail portions are spaced at least partially in a predetermined longitudinal direction that is perpendicular to said lateral direction.

9. The improvement described in claim 6 wherein said connector includes a second plurality of contacts substantially identical to said first-mentioned contacts but mounted with their terminal portions lying adjacent to a second side of said region, and including:

a second frame element, the middle portions of said second plurality of contacts being substantially embedded in said second element;

a spring coupled to both of said frame elements and urging them toward each other, said spring having a frame-separating portion lying between said frame elements;

a cam operable to further separate said frame elements and then deflect said frame-separating portion of said spring from between said frame elements.

10. An electrical connector for connecting to multiple electrically conductive pads on a module, comprising:

a pair of frame elements that form a module-receiving region between them, and that are moveable toward and away from each other;

a plurality of contacts mounted on each of said frame elements, said contacts having terminal portions that make and break contact with conductive pads on a module lying substantially in said module-receiving region when said frame elements move respectively toward and away from said module-receiving region;

a spring with opposite frame-engaging portions engaged with said pair of frame elements and urging them toward said module-receiving region;

means that includes a frame-separating portion which can move between an open position wherein it lies between said frame elements to keep them separated and away from said module-receiving region, and wherein said frame-separating portion can be deflected away from said open position to a closed position wherein it allows said frame elements to move closer together;

a cam which is moveable between an open position wherein it allows said frame-separating portion to lie in said open position between said frame elements, and a closing position wherein it holds said fame separating portion away from said open position to allow said frame-engaging portions of said spring to move said frame elements toward each other.

11. The connector described in claim 10 wherein:

said cam is moveable from said open position to a second position wherein said cam holds said frame elements further apart than in said open position, to a third position wherein said cam continues to hold said frame elements further apart than in said open position while pressing said frame-separating portion away from said open position to said closing position.

12. The connector described in claim 10 wherein:

said frame-separating portion is a part of said spring.

13. The connector described in claim 10 including:

a plurality of pairs of additional frame elements, each pair being substantially the same as said first mentioned pair of frame elements and lying on opposite sides of said module-receiving region;

a plurality of additional contacts; and spring means that include said spring, for urging each of said pairs of frame elements toward said region;

said cam is elongated and has a plurality of portions of different cross sections that sequentially engage said pairs of frame elements as the cam moves along its length.

14. A method for contacting conductive pads on a module, comprising:

establishing first and second groups of elongated contacts that have elongated flexible tail portions, terminal portions, and middle portions between the tail and terminal portions, with the tail portions held to a base and with the terminal portions of each group lying on a different side of a module-receiving region;

fixing the middle portions of each of said groups of contacts to a dielectric frame element spaced from said base, so said middle portions of each group are held at fixed distances from each other;

applying forces to said frame elements to move them toward said module-receiving region, while supporting each of said frame elements primarily on the flexible tail portions of the corresponding group of contacts.

15. The method described in claim 14 wherein:

said step of applying forces includes establishing a spring device between said frame elements that urges them together, including establishing a portion of said spring device between said frame elements to keep the frame elements apart; and including deflecting said spring device portion from between said frame elements, to allow said spring device to move said frame elements and the terminal portions of the contacts toward the module-receiving region.

* * * * *